United States Patent
Koui

(10) Patent No.: US 6,300,153 B1
(45) Date of Patent: *Oct. 9, 2001

(54) METAL ORGANIC VAPOR PHASE EPITAXY AND METHOD FOR MANUFACTURING SEMICONDUCTOR LASER DEVICE

(75) Inventor: Tomoaki Koui, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/396,857

(22) Filed: Sep. 15, 1999

(30) Foreign Application Priority Data

Mar. 8, 1999 (JP) .................................................. 11-060184

(51) Int. Cl.$^7$ .................................................. H01L 21/00
(52) U.S. Cl. .............................. 438/46; 438/41; 438/42; 438/45
(58) Field of Search .................................. 438/41–46, 31, 438/496, 481

(56) References Cited

U.S. PATENT DOCUMENTS

| | | | |
|---|---|---|---|
| 5,918,109 | * 6/1999 | Koui | 438/39 |
| 6,001,665 | * 12/1999 | Ishizumi | 438/46 |
| 6,030,452 | * 2/2000 | Takeuchi | 438/289 |
| 6,036,771 | * 3/2000 | Sakata | 438/31 |

OTHER PUBLICATIONS

Matsumoto, Takashi et al., "Highly uniform InGaAsP growth by dual–fluid–layer structure metalorganic vapor phase epitaxy reactor with atmospheric pressure", Journal of Crystal Growth 145 (1994) 622–629.

Sakata, Y. et al., "Low Threshold and High Uniformity for Novel 1.3–$\mu$m–Strained InGaAsP MQW DC–PBH LD's Fabricated by the All–Selective MOVPE Technique", IEEE Photonics Technology, vol. 9, No. 3, Mar. 1997, pp. 291–293.

* cited by examiner

Primary Examiner—David Nelms
Assistant Examiner—Dung A Le
(74) Attorney, Agent, or Firm—Hutchins, Wheeler & Dittmar

(57) ABSTRACT

First, a waveguide which lases in accordance with a predetermined voltage applied thereto is formed on a predetermined region on a substrate. An $SiO_2$ mask is formed on a top of the waveguide. Then, a current-blocking layer of group III material and group V material for blocking a current is formed on the substrate and the waveguide except a top of the waveguide on which the $SiO_2$ mask is formed. In this step, the group III material including group III elements and the group V material including group V elements in the current-blocking layer are supplied to the surface of the substrate. A migration length of the group III material on the surface is controlled by controlling at least one of the growth temperature of the current-blocking layer and the pressure of the supplied group V material. And a cladding layer is formed after the $SiO_2$ mask is removed, on the waveguide and the current-blocking layer and a contact layer is formed on the cladding layer. And then, an electrode is formed on the contact layer and another electrode is formed on a surface of the substrate which is opposite to the surface on which the waveguide is formed, thus a semiconductor laser device is completed.

11 Claims, 10 Drawing Sheets

METAL ORGANIC VAPOR PHASE EPITAXY AND METHOD FOR MANUFACTURING SEMICONDUCTOR LASER DEVICE

BACKGROUND OF THE INVENTION

1. Field of the Invention

The present invention relates to a metal organic vapor phase epitaxy (MOVPE) method. And the present invention relates to a method for manufacturing a semiconductor laser device, more particularly to a method for manufacturing a semiconductor laser device by MOVPE.

2. Description of the Related Art

A metal organic vapor phase epitaxy (MOVPE) method has been known as a technique for manufacturing a semiconductor laser device. Selective MOVPE realizes selective film formation. That is, a film (composition semiconductor film) is selectively formed on exposed regions which are not masked by an $SiO_2$ film.

"IEEE Photonics Technology Letter 9 (1997) p.291" (hereinafter referred to as Document 1) discloses a technique for manufacturing a double-channel planar buried heterostructure (DC-PBH) laser diode having InGaAsP multiquantum wells (MQW) structure by the selective MOVPE.

FIGS. 9A to 9F show steps of manufacturing a semiconductor laser diode by the technique disclosed in Document 1.

First, the chemical vapor deposition is carried out to deposit an $SiO_2$ film 180 having the thickness of 100 nm onto a (100) just oriented n-InP substrate 110, as shown in FIG. 9A.

Then, the $SiO_2$ film 180 is patterned so as to be striped masks as shown in FIG. 9B. The mask width Wm is 8-micron wide and the width Wo of open stripe 180A is 1.5 microns wide. These stripes are extending in the [011] direction.

Then, a waveguide 120 (having the double heterostructure) containing an MQW active layer is formed by selective MOVPE on the open stripe region 180A as shown in FIG. 9C. The MQW active layer, 121 consists of 0.7% compressively strained InGaAsP wells (5-nm thick) and InGaAsP barriers (each of which has the thickness of 8 nm, and emits lights having 1.13-micron wavelength), sandwiched by InGaAsP SCH layers (each of which has the thickness of 60 nm, and emits lights having 1.13-micron wavelength).

Then, an $SiO_2$ mask 190 is formed on the top of the waveguide 120 using a self-alignment process as shown in FIG. 9D, and the $SiO_2$ portion other than the $SiO_2$ mask 190 is removed.

A current-blocking layer 130 is selectively grown on the substrate 110 by selective MOVPE as shown in FIG. 9E. The current-blocking layer 130 consists of p-InP (having the carrier concentration of $3 \times 10^{17} cm^{-3}$ and the thickness of 0.75 microns), n-InP (having the carrier concentration of $3 \times 10^{17} cm^{-3}$ and the thickness of 0.7 microns) and p-InP (having the carrier concentration of $3 \times 10^{18} cm^{-3}$ and the thickness of 0.10 microns) layers. Then, the $SiO_2$ mask 190 is removed.

After the $SiO_2$ mask 190 is removed, a p-InP cladding layer 140 is formed on the waveguide 120 and the current-blocking layer 130 as shown in FIG. 9F. Further, a $p^-$-InGaAs contact layer 150 is formed on the p-InP cladding layer 140.

Finally, a p-type electrode 160 is formed on the $p^+$-InGaAs contact layer 150 and an n-type electrode 170 is formed on a back surface (a surface opposing to the surface on which the waveguide 120 is formed) of the substrate 110. Thus, the DC-PBH structure semiconductor laser diode is completed by the selective MOVPE.

Document 1 discloses the process of manufacturing the semiconductor laser diode, however, it does not suggest that the shape of the diode surface (an uneven surface or a planar surface as shown in FIG. 9F) is selectable during the process disclosed in Document 1, because it does not mention at all the growth rate of the composition semiconductor film growing by MOVPE. Therefore, a case, wherein the diode must be processed so as to have a suitable surface shape in accordance with its purpose, may be required later.

"Journal of Crystal Growth 145 (1994) p.622" (hereinafter referred to as Document 2) discloses highly uniform InGaAsP growth by MOVPE with atmospheric pressure which is another technique for manufacturing a semiconductor laser device.

Since InGaAsP grows uniformly according to the technique disclosed in Document 2, a surface of the grown film will be uneven when a base layer beneath is uneven. In other words, a planar surfaced film is unavailable on an uneven base. A case, wherein the completed semiconductor laser device must be processed so as to have a suitable surface in accordance with its purpose, may be required later.

SUMMARY OF THE INVENTION

It is an object of the present invention to provide a metal organic vapor phase epitaxy method and a method for manufacturing a semiconductor laser device which can control a surface shape of a film (composition semiconductor film).

To achieve the above object, a metal organic vapor phase epitaxy method according to a first aspect of the present invention comprises:

preparing a base having a (100) oriented surface and a higher order surface; supplying a group III material including group III elements and a group V material including group V elements to the surface of said base as a material for a composition semiconductor film; and forming the composition semiconductor film with the supplied group III material and group V material while controlling a migration length of the group III material on the surface.

According to this invention, a surface shape of the composition semiconductor film is controllable by changing the migration length of the group III material on the surface wherein the growth rates of the (100) oriented surface and the higher order surface depend on the migration length.

The forming may comprise controlling the migration length of the group III material on the surface by controlling a growth temperature of the composition semiconductor film.

The forming may comprise controlling the growth temperature so as to be equal to or lower than 600 degrees Celsius.

The forming may comprise expanding the migration length of the group III material on the surface by controlling the growth temperature so as to be in the range of 575 to 600 degrees Celsius.

The forming may comprise controlling the migration length of the group III material on the surface by controlling a pressure of the supplied group V material.

The forming may comprise expanding the migration length of the group III material on the surface by controlling the pressure so as to be in the range of 0.65 to 6.2 Torr.

The supplying and the forming may be carried out with an atmospheric pressure.

The forming may comprise:

using In as said group III elements; and using P as said group V elements.

A method for manufacturing a semiconductor laser device comprises:

forming a waveguide, which lases in accordance with a predetermined voltage applied thereto, on a predetermined region of a substrate;

forming a current-blocking layer of group Ill material and group V material for blocking a current, by metal organic vapor phase epitaxy on the substrate and the waveguide except a top of the waveguide;

forming a cladding layer on said waveguide and said current-blocking layer;

forming a contact layer on said cladding layer;

forming an electrode on said contact layer and forming another electrode on a surface of the substrate which is opposite to the surface on which the waveguide is formed, wherein the forming the current-blocking layer comprises:

supplying group III material including group III elements and group V material including group V elements to the surface of the substrate on which said waveguide is formed; and forming the current-blocking layer while controlling a migration length of the group III material on the surface.

According to this invention, a surface shape of the current-blocking layer is controllable by changing the migration length of the group III material on the surface wherein the growth rate of the current-blocking layer depends on the migration length.

The forming the current-blocking layer may comprise controlling the migration length on the surface by controlling a growth temperature of the current-blocking layer.

The forming the current-blocking layer comprises controlling the growth temperature so as to be equal to or lower than 600 degrees Celsius.

The forming the current-blocking layer may comprise expanding the migration length on the surface by controlling the growth temperature so as to be in the range of 575 to 600 degrees Celsius.

The forming the current-blocking layer may comprise controlling the migration length on the surface by controlling a pressure of the supplied group V material.

The forming the current-blocking layer may comprise expanding the migration length on the surface by controlling the pressure so as to be in the range of 0.65 to 6.2 Torr.

The forming the current-blocking layer may be carried out with an atmospheric pressure.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

A method for manufacturing a semiconductor laser device by metal organic vapor phase epitaxy according to a first embodiment of the present invention will now be described with reference to the drawings.

In this embodiment, a double-channel planar buried heterostructure (DC5-PBH) laser diode will be produced as the semiconductor laser device.

Figure 1:
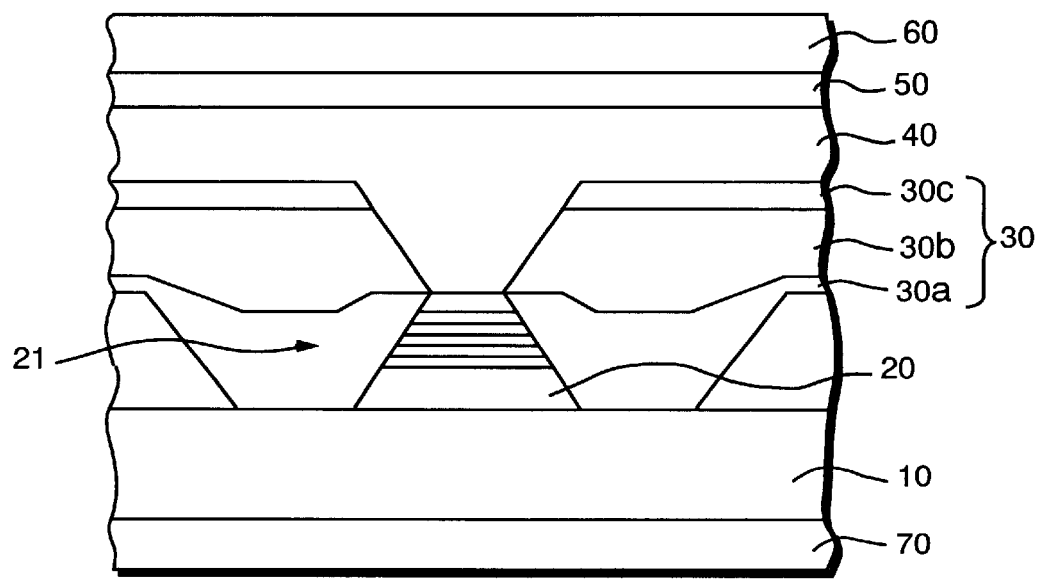
FIG. 1 is a cross sectional view showing the structure of a semiconductor laser device manufactured by a method according to a first embodiment.

As shown in FIG. 1, the semiconductor laser device comprises a substrate 10, a waveguide 20, a current-blocking layer 30, a cladding layer 40, a contact layer 50, a p-type electrode 60 and an n-type electrode 70.

The substrate 10 is, for example, a (100) oriented substrate made of n-type InP.

Figure 2:
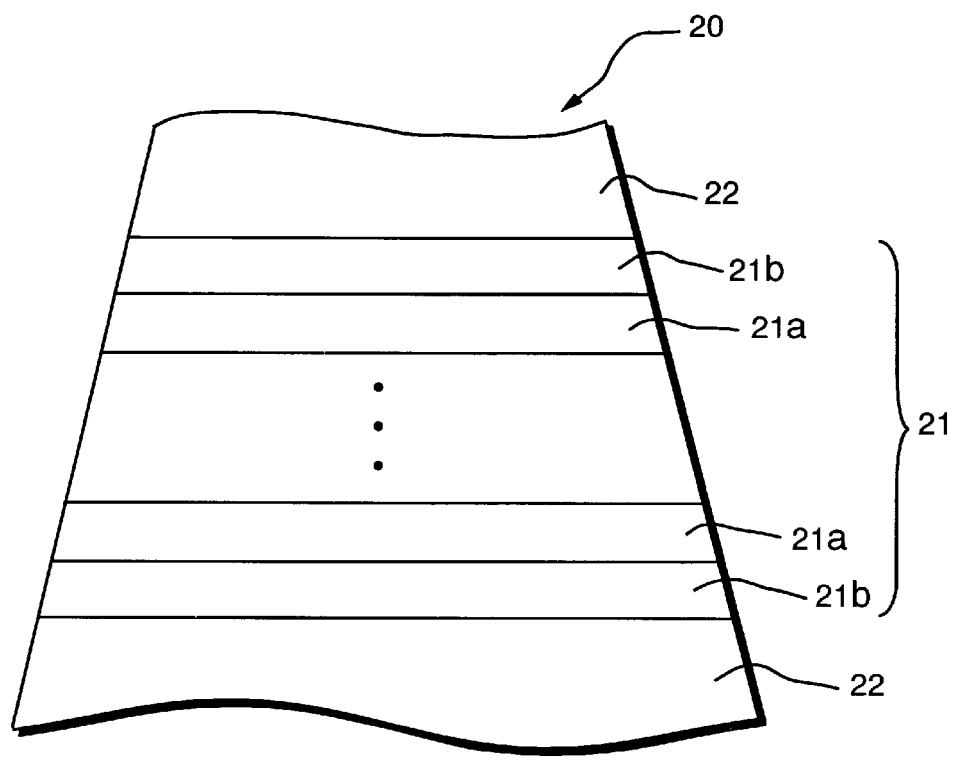
FIG. 2 is a diagram showing the structure of a waveguide shown in FIG. 1.

The waveguide 20, which is formed on a predetermined region on the substrate 10, lases in accordance with a predetermined voltage applied thereto. The waveguide 20 has the double heterostructure, that is, a multiquantum wells (MQW) layer 21 and SCH layers 22 sandwiching the MQW layer 21 as shown in FIG. 2. The MQW layer 21 comprises barrier layers 21A of InGaAsP and well layers 218 of InGaAsP. Each of the barrier layers 21A has the thickness of approximately 8 nm and emits lights having approximately 1.13-micron wavelength, while each of the well layers 21B is 0.7% compressive strained and has the thickness of approximately 5 nm. Each of the SCH layers has the thickness of approximately 60 nm and emits lights having approximately 1.13 micron wavelength.

As shown in FIG. 1, the current-blocking layer 30 on the substrate 10 and the waveguide 20 except the top surface of the waveguide 20. The current-blocking layer 30 comprises a bottom layer 30A of p-InP, an intermediate layer 30B of n-InP, and a top layer 30C of p-InP. The p-InP layer 30A has the carrier concentration of approximately $3 \times 10^{17} cm^{-3}$ and the thickness of approximately 0.75 microns. The n-InP layer 30B has the carrier concentration of approximately $7 \times 10^{17} cm^{-3}$ and the thickness of 0.7 microns. The p-InP layer 30C has the carrier concentration of approximately $3 \times 10^{18} cm^{-3}$ and the thickness of 0.10 microns. That is, the current-blocking layer 30 forms a counter connecting structure which effectively blocks a current.

The cladding layer 40 of p-InP is formed on the waveguide 20 and the current-blocking layer 30.

The contact layer 50 of p+-InGaAs is formed on the cladding layer 40.

The p-type electrode 60 is formed on the contact layer 50 and it will act as an anode of the semiconductor laser device.

The n-type electrode 70 is formed on a back surface of the substrate 10 (that is, a surface opposing to the surface on which the waveguide 20 is formed) and it will act as a cathode of the semiconductor laser device.

Manufacturing process for the above described semiconductor laser device will now be described.

FIGS. 3A to 3F are cross sectional views showing the steps of manufacturing the semiconductor laser device. In this manufacturing process, each step is carried out with an atmospheric pressure.

Figure 3A:
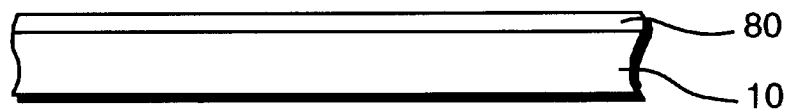
FIGS. 3A to 3F are cross sectional views showing manufacturing steps of the semiconductor laser device shown in FIG. 1.

First, the chemical vapor deposition (CVD) is carried out to form an $SiO_2$ film 80 onto the substrate 10 as shown in FIG. 3A.

Figure 3B:
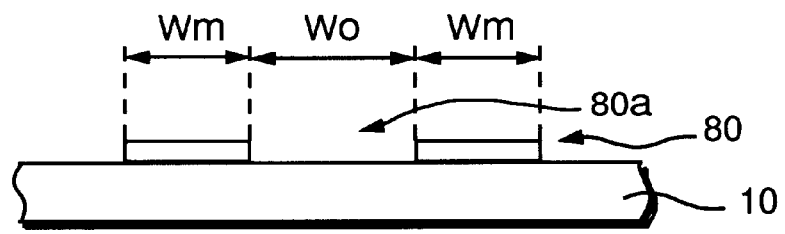

As shown in FIG. 3B, the $SiO_2$ film 80 is patterned by a photolithographic technique so as to be striped masks used for selectively forming the waveguide 20 on a predetermined region of the substrate 10. The mask width Wm is in the range of 1 to 100 microns, more preferably in the range of 5 to 50 microns. The width Wo of each of the open stripes 80A is in the range of 1 to 5 microns, more preferably in the range of 1.5 to 2 microns. These stripe masks extend in the [011] direction.

Figure 3C:
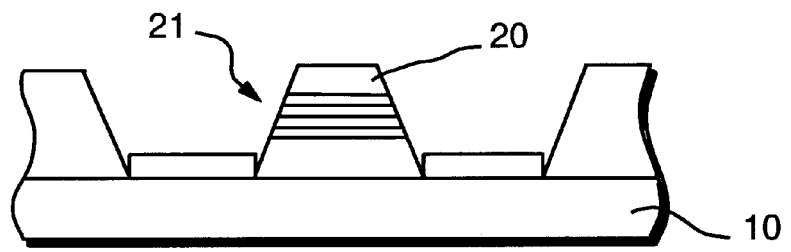

In the same manner as the conventional technique, the waveguide 20 including the MQW layer 21 is formed on the open stripe 80A by selective MOVPE as shown in FIG. 3C.

Figure 3D:
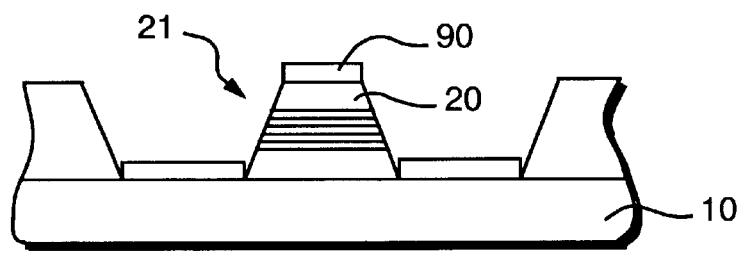

Then, the CVD is carried out to form an $SiO_2$ mask 90 onto the top of the waveguide 20 using self-alignment process as shown in FIG. 3D. And then, $SiO_2$ portions other than the $SiO_2$ mask 90 is removed.

Figure 3E:
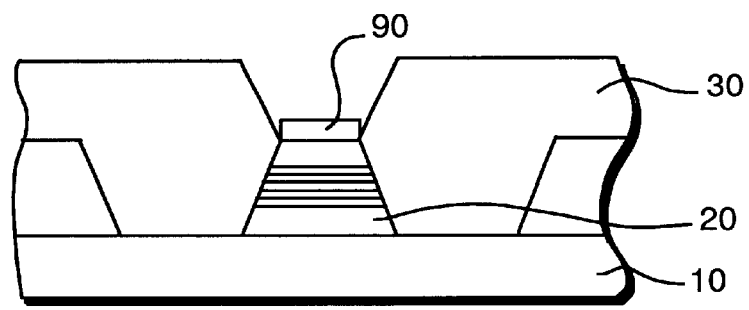

After the $SiO_2$ portions other than the $SiO_2$ mask 90 is removed, the current-blocking layer 30 is formed on regions expect the $SiO_2$ mask 90 by the MOVPE with an atmospheric pressure as shown in FIG. 3E. During this MOVPE process, the surface of the current-blocking layer 30 is controllable to have a desired shape (detailed process will be described later). And then, the $SiO_2$ mask 90 is removed.

Figure 3F:
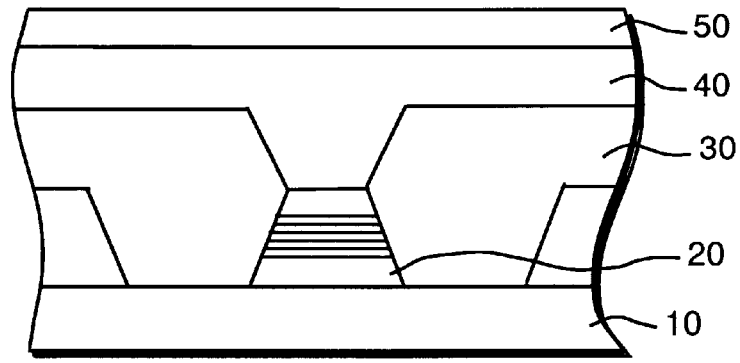

After the $SiO_2$ mask 90 is removed, the cladding layer 40 and the contact layer 50 are formed by, for example, MOVPE, as shown in FIG. 3F.

Finally, the p-type electrode 60 is formed on the contact layer 50 and the n-type electrode 70 is formed on the back surface of the substrate 10.

Thus, the semiconductor laser device shown in FIG. 1 is completed.

In the step of forming the current-blocking layer 30 shown in FIG. 3E, the surface shape of the current-blocking layer 30 varies in accordance with the growth rate on a (100) oriented surface and the growth rate on a higher order surface such as a (311) oriented surface.

The growth rate depends on a migration length of a group III material, which partially comprises the current-blocking layer 30, on the surface. In this case, the group III material is for example, indium (In).

Figure 4A:
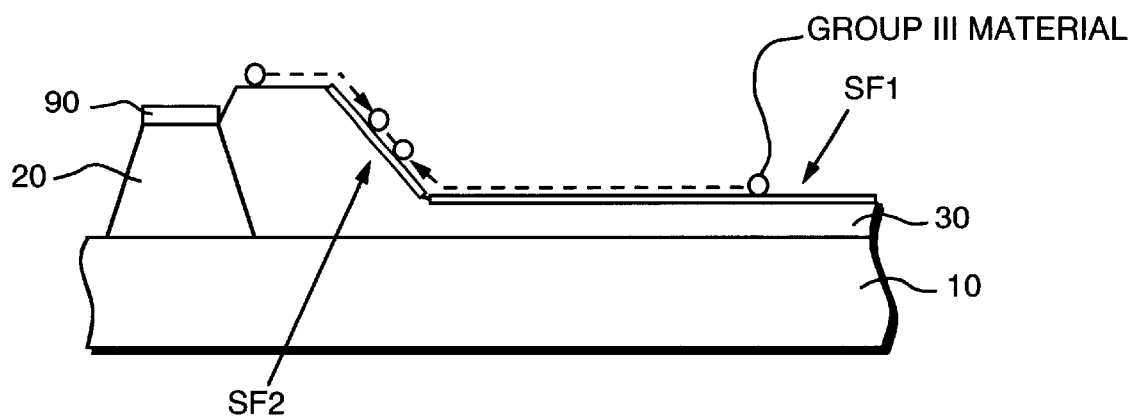
FIGS. 4A and 4B are diagrams showing the difference in surface migration lengths of group III composition.

In a case where the migration length is long as shown in FIG. 4A, the supplied group III material on a (100) oriented surface SF1 is taken into a higher order surface SF2 and helps the growth of the higher order surface SF2. Therefore, the higher order surface SF2 grows faster than the (100) oriented surface SF1.

Figure 4B:
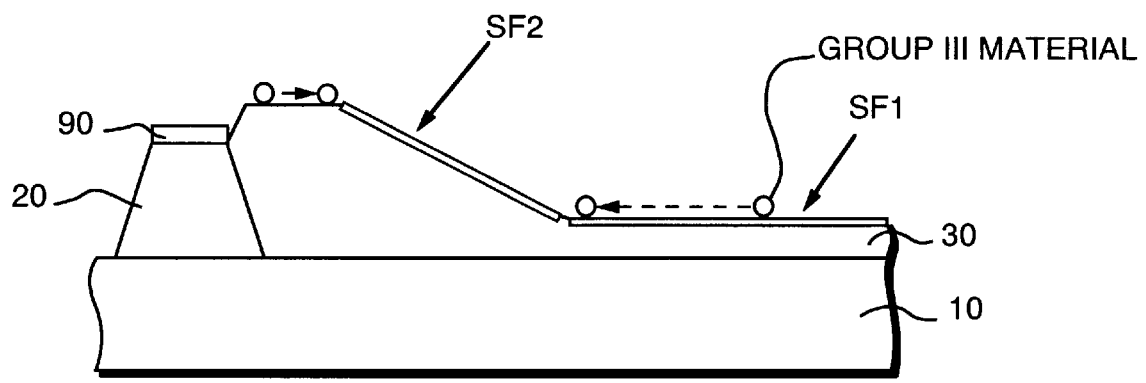

On the contrary, the supplied group III material on the (100) oriented surface SF1 helps the growth of the (100) oriented surface SF1 before it is taken into the higher order surface SF2 when the migration length does not expand greatly as shown in FIG. 4B. In this case, the growth rates of the (100) oriented surface SF1 and the higher order surface SF2 are almost equal.

The flow (that is, pressure) of a group V material (such as $PH_3$) which is supplied with the group III material determines the migration length of the group III material.

The greater the group V material flows, the higher the pressure of the group V material becomes. Since the pressure of the group V material which helps the growth of the film is high, the migration length of the group III material does not expand greatly. Thus, the growth rates of the (100) oriented surface and the higher order surface are almost equal. On the contrary, the migration length of the group III material becomes longer when the flow of the group V material is less.

In this case, the growth rate of the higher order surface becomes enough higher than that of the (100) oriented surface.

Figure 5A:
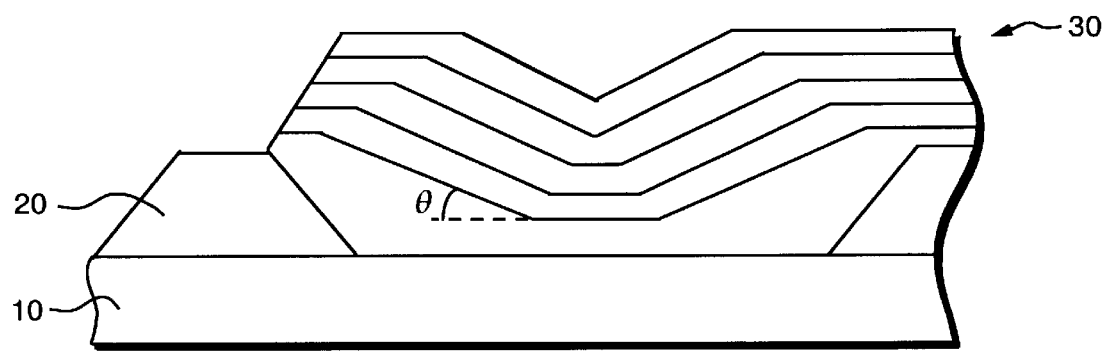
FIGS. 5A and 5B are diagrams showing the difference in surface shapes in accordance with the growth rates of films.
Figure 5B:
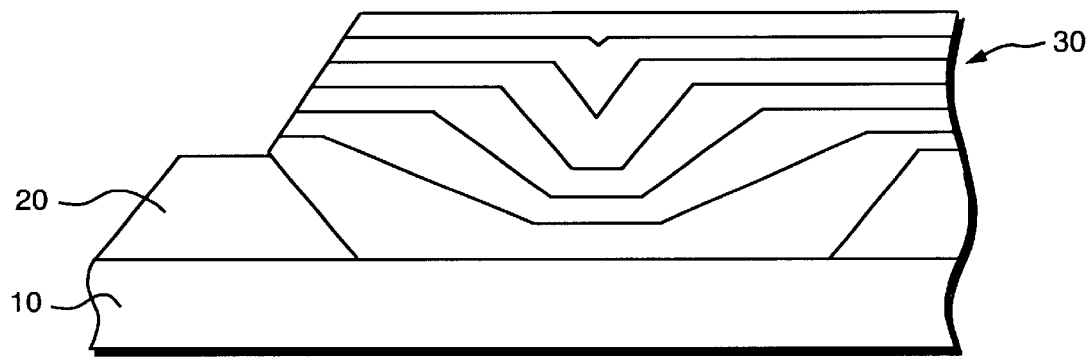

In the case where the group V material flows greatly, the current-blocking layer 30 grows with reflecting a surface shape of an uneven base layer beneath. Therefore, the current-blocking layer 30 also becomes uneven as shown in FIG. 5A. When the flow of the group V material is less, the surface of the current-blocking layer 30 becomes planar as shown in FIG. 5B, because the higher order surfaces grow greatly. Since each of thus formed higher order layers grows fast, recessed portions in the growing current-blocking layer 30 are gradually buried and the surface of the grown current-blocking layer 30 eventually become planar.

Also oblique angles of the higher order surfaces of the current-blocking layer 30 depend on the pressure of the group V material. An angle θ shown in FIG. 5A represents the oblique angle between the (100) oriented surface and the higher order surface.

Figure 6:
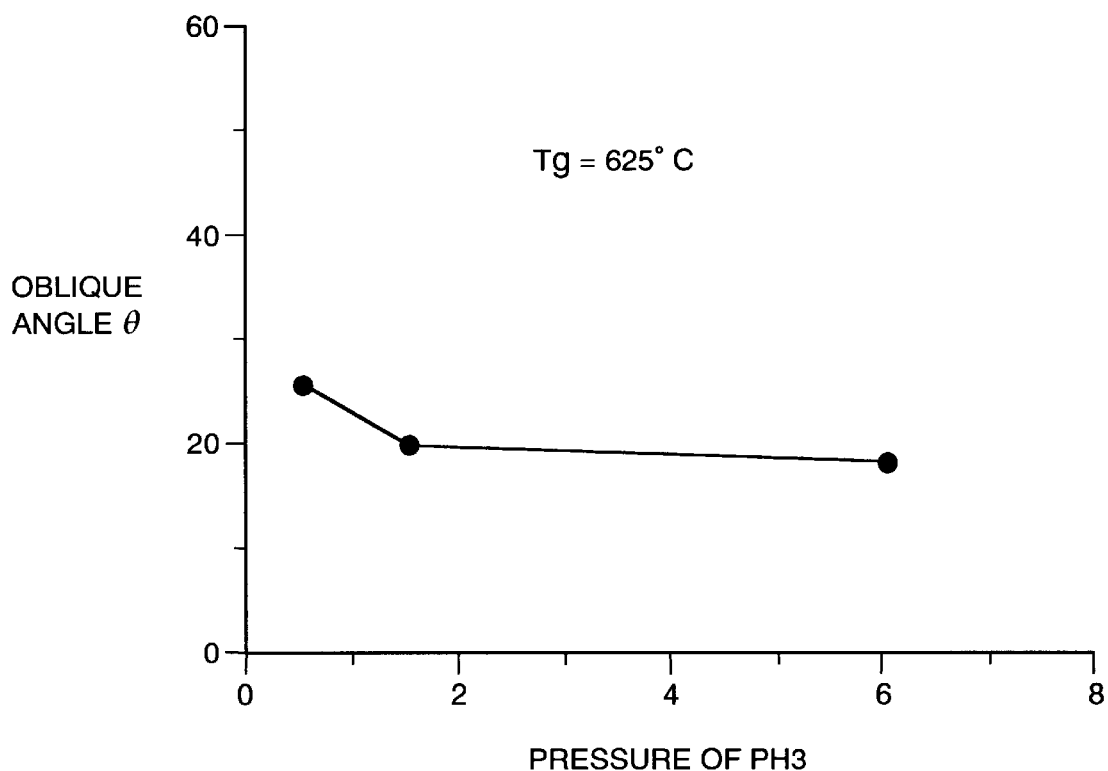
FIG. 6 is a diagram showing the relationship between the pressure of $PH_3$ and an oblique angle of a growing current-blocking layer.

FIG. 6 is a graph showing the relationship between the pressure of $PH_3$ (group V material) and the oblique angle of the current-blocking layer 30. Index pressure of $PH_3$ of the graph in FIG. 6 is in the range of 0.65 to 6.2 Torr.

It is obvious from FIG. 6 that the oblique angle is small when the $PH_3$ is supplied with high pressure, and the oblique angle becomes larger as the pressure of $PH_3$ becomes lower.

Accordingly, the current-blocking layer 30 having a planar surface is available by controlling the pressure of $PH_3$ so as to be less, because the less pressure helps the growth of higher order surface in the current-blocking layer 30. In other words, higher order surface grows fast, so that recessed portions of in the growing current-blocking layer 30 are gradually buried and the surface of the grown current-blocking layer 30 eventually becomes planar.

With the growth temperature of 625 degrees Celsius and the pressure of $PH_3$ of 6.2 Torr for example, the current-blocking layer 30 having an uneven surface is available by MOVPE with an atmospheric pressure. The above parameters bring higher pressure of $PH_3$ which controls the migration length of the group III material not to be longer. Thus, the growth rate of the higher order surface is almost equal to that of the (100) oriented surface. More precisely, the higher order surface grows approximately 1.3 times faster than the (100) oriented surface. Such the growth rates help each of the layers in the current-blocking layer 30 to grow with reflecting a shape of the base layer beneath.

The migration length of the group III material becomes longer by setting the pressure of the group V material ($PH_3$)

so as to be less than that in the above example, more precisely reducing the pressure approximately ½ to ¹/₁₀₀ times less than that in the above example. That is, the higher order surface grows faster than the (100) oriented surface. As a result, the current-blocking layer 30 has a planar surface. If the pressure of the group V material is too low, the migration length of the group III material becomes too long, and vice versa. Preferable pressure of the group V material is 0.65 Torr. (¹/₁₀ times less than that in the above example) to obtain a suitable migration length under the growth temperature of 625 degrees Celsius (which is the same as that in the above example). This pressure causes the higher order surface to grow approximately 2.5 times faster than the (100) oriented surface, thus, the surface of the current-blocking layer 30 becomes planar.

Figure 7A:
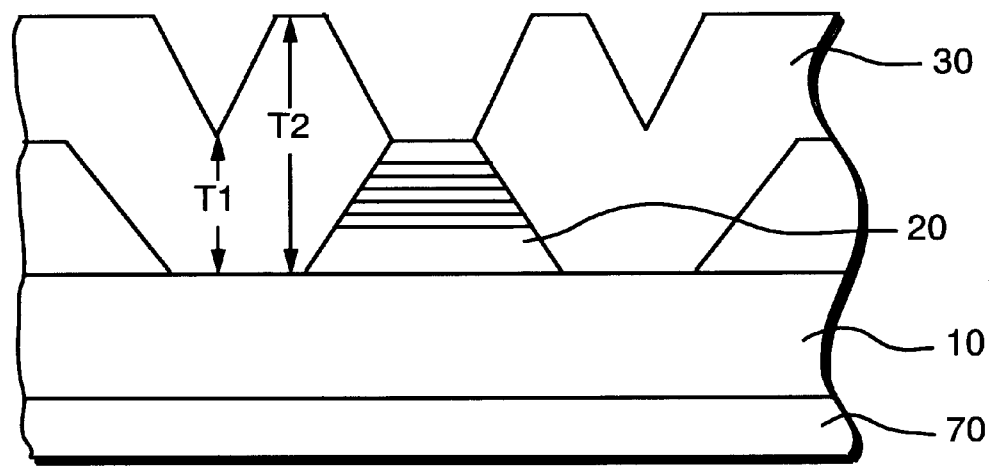
FIG. 7A is a cross sectional view showing a completed current-blocking layer having an uneven surface.

The inventor demonstrated the surface controllability by actually forming different surfaced current-blocking layers 30. FIG. 7A shows a current-blocking layer 30 having an uneven surface which was obtained after setting the pressure of $PH_3$ at 6.2 Torr. In this case, the ratio of the minimum thickness T1 to the maximum thickness T2 of the current-blocking layer 30 (T1/T2) was 0.7.

Figure 7B:
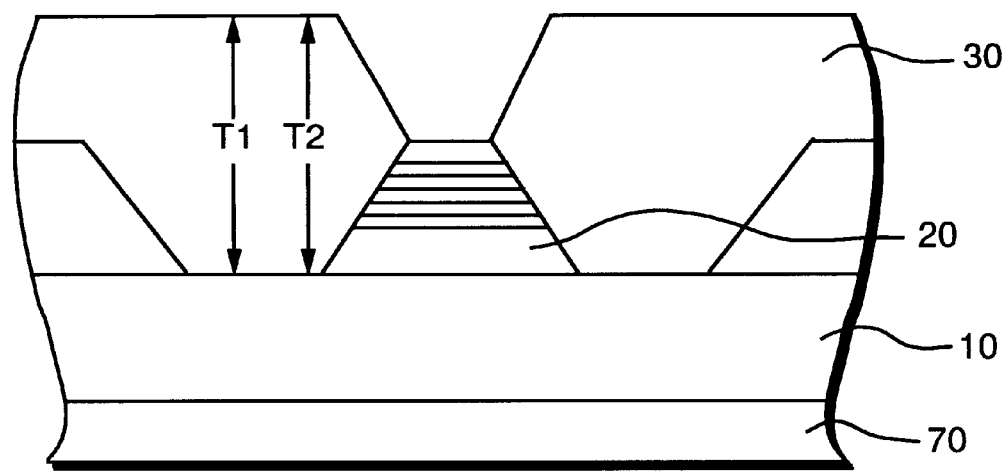
FIG. 7B is a diagram showing a completed current-blocking layer having a planar surface.

FIG. 7B shows another current-blocking layer 30 having a planar surface obtained after setting the pressure at 0.65 Torr. In this case, the thickness ratio was equal to or greater than 0.9.

Accordingly, the surface shape of the current-blocking layer 30 is controllable by changing the pressure of the group V material, because the migration length of the group III material depends on it.

Thus, the surface shape of the current-blocking layer 30 (or the buried structure) may be flexibly controlled in accordance with the purpose of a semiconductor laser device. Such the surface shape controllability gives flexibility to the manufacturing process of a semiconductor laser device. That is, a surface of the semiconductor laser device may be processed flexibly in accordance with the purpose during its manufacturing process before completion. This helps manufacturers to provide semiconductor laser devices each having excellent quality as an element.

Second Embodiment

A method for manufacturing a semiconductor laser device according to a second embodiment will now be described with drawings.

The semiconductor laser device in this embodiment is substantially the same as that in the first embodiment.

Steps of manufacturing the semiconductor laser device in this embodiment are substantially the same as those in the first embodiment except a step of forming the current-blocking layer 30.

In the second embodiment, the pressure of supplied group V material (which helps the film to grow greatly) will be controlled by varying the growth temperature of the current-blocking layer 30, while the pressure of the group V material is controlled by varying the flow thereof in the first embodiment. More precisely, this embodiment will describe that the growth temperature of the current-blocking layer 30 is controlled so as to be in the range which allows the crystal growth.

The growth of the current-blocking layer 30 starts after the group V material (such as $PH_3$) is decomposed. Since the decomposition rate of $PH_3$ greatly depends on the temperature, the pressure of the group V material (more precisely, the pressure of phosphorous (P)) will be easily controlled in accordance with the variation of the growth temperature.

As described in the first embodiment, the migration length of the group III material on the surface depends on the pressure of the group V material which is effective in the growth. The variation of the migration length controls the growth rates of the (100) oriented surface and the higher order surface, and the surface shape of the current-blocking layer 30 varies in accordance with the growth rates. Accordingly, the surface shape controllability of the current-blocking layer 30 results from controlling the growth temperature of the current-blocking layer 30.

More precisely, a low growth temperature controls $PH_3$ not to be decomposed greatly, thus, the pressure of the group V material (which is effective in the growth) is low. As a result, the current-blocking layer 30 has a planar surface. On the contrary, a high growth temperature helps decomposition of $PH_3$, thus, the pressure of the group V material (which is effective in the growth) is high. As a result, the current-blocking layer 30 has an uneven surface.

Figure 8:
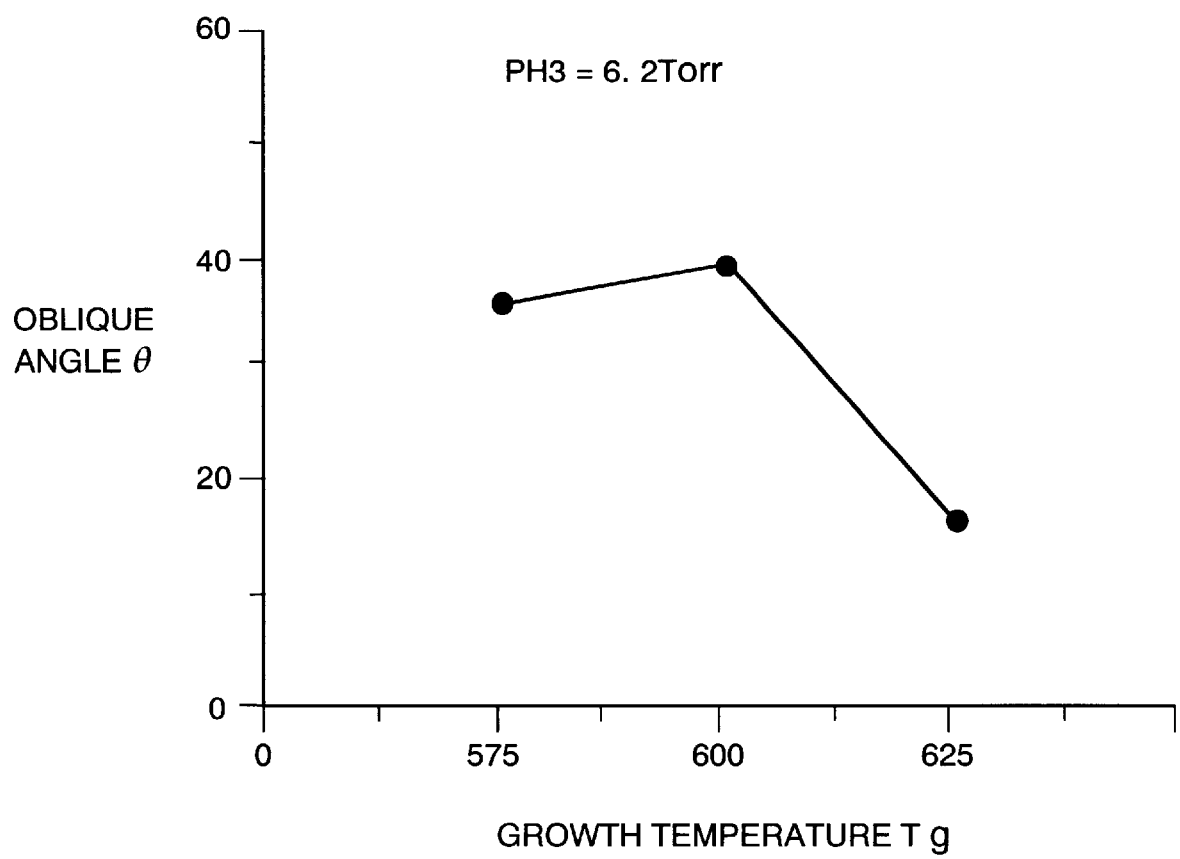
FIG. 8 is a diagram showing the relation ship between the growth temperature and the oblique angle of the current-blocking layer.
Figure 9A:
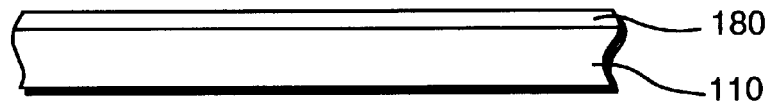
FIGS. 9A to 9F are cross sectional views showing conventional manufacturing steps of a semiconductor laser device.
Figure 9B:
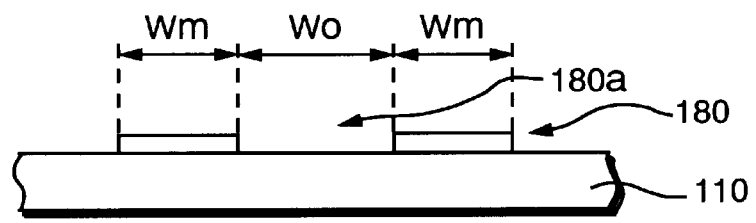
Figure 9C:
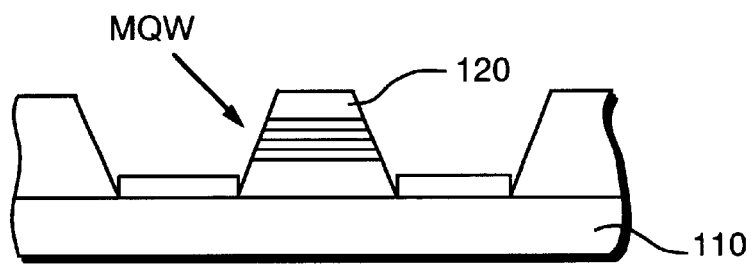
Figure 9D:
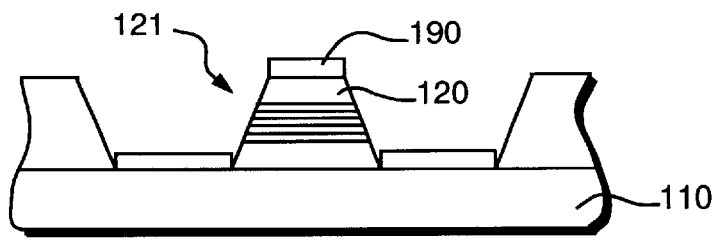
Figure 9E:
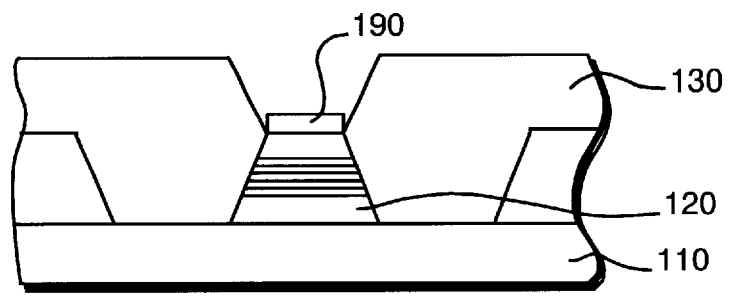
Figure 9F:
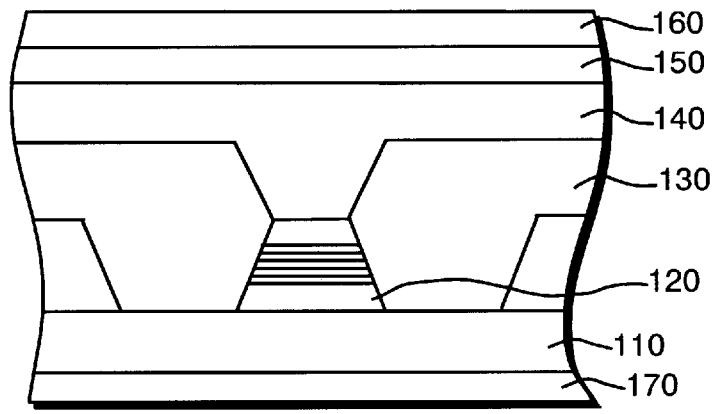

Oblique angles of the layers in the current-blocking layer 30 also changes as the growth temperature thereof changes. FIG. 8 shows the relationship between the growth temperature and the oblique angle.

As shown in FIG. 8, the oblique angle is large in an area where the growth temperature is equal to or lower than 600 degrees Celsius (more precisely, 575 to 600 degrees Celsius). The oblique angle becomes smaller radically in an area where the growth temperature is over 600 degrees Celsius. That is, recessed portions in the growing current-blocking layer 30 are buried effectively when the growth temperature is equal to or lower than 600 degrees Celsius. Accordingly, the planar surfaced current-blocking layer 30 is formed efficiently when the growth temperature of the current-blocking layer 30 is set so as to be equal to or lower than 600 degrees Celsius.

To obtain the current-blocking layer 30 having an uneven surface by MOVPE with an atmospheric pressure, the growth temperature of the current-blocking layer 30 should be set so as to be in the range of 625 to 650 degrees Celsius. Such the temperature improves the decomposition rate of $PH_3$, thus, the migration length of the group III material does not expand greatly.

On the contrary, the decomposition rate of $PH_3$ is low when the growth temperature is set so as to be, for example, equal to or lower than 600 degrees Celsius. In this case, the migration length of the group III material becomes longer because of the low decomposition rate, thus, the completed current-blocking layer 30 has a planar surface. $PH_3$ is hardly decomposed when the growth temperature is extremely low, and the epitaxial film does not grow with such a temperature. If the growth temperature is near 600 degrees Celsius, the surface of the current-blocking layer 30 will be uneven because of high decomposition rate of $PH_3$. To avoid the above disadvantages, the growth temperature should be set so as to be approximately 575 degrees Celsius. The decomposition rate of $PH_3$, when the growth temperature is set so as to be approximately 575 degrees Celsius, is approximately ¹/₁₀ times less than that when the growth temperature is in the rage of 625 to 650 degrees Celsius. In other words, setting the growth temperature so as to be approximately 575 degrees Celsius brings the same effect caused by reducing the flow of $PH_3$ so as to be ¹/₁₀.

Accordingly, the surface shape of the current-blocking layer 30 is controllable by controlling the growth temperature of the current-blocking layer 30, because the decomposition rate of the group V material depends on the growth temperature.

Thus, the surface shape of the current-blocking layer 30 (or the buried structure) may be flexibly controlled in accordance with the purpose of a semiconductor laser device. Such the surface shape controllability gives flexibility to the manufacturing process of a semiconductor laser device. That is, a surface of the semiconductor laser device may be processed flexibly in accordance with the purpose during its manufacturing process before completion. This helps manufacturer to provide semiconductor laser devices each having excellent quality as an element.

The techniques described in the first and second embodiments for forming the current-blocking layer 30 may be combined to each other. For example, both the pressure of the group V material and the growth temperature may be controlled to obtain a desired current-blocking layer 30.

Even in a case of film formation by MOVPE with reduced pressure, a surface shape of a thin film to be formed is also controllable by controlling the pressure of the group V material or the growth temperature. A film having a planar surface is available under, for example, the growth temperature of 575 degrees Celsius, the $PH_3$ pressure of 0.65 Torr and the growth rate of 1.7 microns/h. In this case, the migration length of the group III material becomes longer because of the reduction of the pressure. On the contrary, setting the growth temperature so as to be higher than 625 degrees Celsius and the $PH_3$ pressure so as to be greater than 6.2 Torr causes the pressure of $PH_3$ to increase. Thus, a film having an uneven surface is formed because the migration length of the group III material does not expand greatly.

The aforementioned metal organic vapor phase epitaxy method may be employed not only in the semiconductor laser device manufacturing process but in manufacturing process for other devices such as a micro-machine. In this case, the feature of MOVPE, that is, forming a film having a desired surface shape may be utilized in the micro-machine manufacturing process e.g. producing various parts (such as gears) to be used in a micro-machine.

Various embodiments and changes may be made thereunto without departing from the broad spirit and scope of the invention. The above-described embodiments are intended to illustrate the present invention, not to limit the scope of the present invention. The scope of the present invention shown by the attached claims rather than the embodiments. Various modifications made with in the meaning of an equivalent of the claims of the invention and within the claims are to be regarded to be in the scope of the present invention.

This application is based on Japanese Patent Application No. H11-060184 filed on Mar. 8, 1999, and including specification, claims, drawings and summary. The disclosure of the above Japanese Patent Application is incorporated herein by reference in its entirety.

What is claimed is:

1. A metal organic vapor phase epitaxy method comprising:

preparing a base having a (100) oriented surface and a higher order surface;

supplying a group III material, including group III elements while maintaining a pressure between 0.65 and 6.2 Torr, and supplying a group V material, including group V elements to the surface of said base as materials for a composition semiconductor film; and forming said composition semiconductor film with said supplied group III material and group V material while controlling a migration length of said group III material on the surfaces of said base.

2. The metal organic vapor phase epitaxy method according to claim 1, wherein said forming comprises controlling a migration length of said group III material on the surfaces of said base by controlling a growth temperature of said composition semiconductor film.

3. The metal organic vapor phase epitaxy method according to claim 2, wherein said forming comprises increasing the migration length of said group III material on the surface by controlling said growth temperature to be in a range of approximately 575 to 600 degrees Celsius.

4. The metal organic vapor phase epitaxy method according to claim 3, wherein said supplying and said forming are carried out with an atmospheric pressure.

5. The metal organic vapor phase epitaxy method according to claim 4, wherein said supplying comprises:

using In (indium) as a selected one of said group III elements; and using P (phosphorous) as a selected one of said group V elements.

6. The metal organic vapor phase epitaxy method according to claim 1, wherein said forming comprises controlling the migration length of said group III material on the surface by controlling a pressure of said supplied group V material.

7. The metal organic vapor phase epitaxy method according to claim 6, wherein said forming comprises expanding the migration length of said group III material on the surface by controlling said pressure to be in the range of 0.65 to 6.2 Torr.

8. The metal organic vapor phase epitaxy method according to claim 7, wherein said forming comprises controlling the migration length of said group III material on the surface by controlling a growth temperature of said composition semiconductor film.

9. The metal organic vapor phase epitaxy method according to claim 8, wherein said forming comprises controlling said growth temperature to be equal to or lower than approximately 600 degrees Celsius.

10. The metal organic vapor phase epitaxy method according to claim 9, wherein said supplying and said forming are carried out with an atmospheric pressure.

11. The metal organic vapor phase epitaxy method according to claim 10, wherein said supplying comprises;

using In (indium) as a selected one of said group III elements; and using P (phosphorous) as a selected one of said group V elements.

* * * * *

UNITED STATES PATENT AND TRADEMARK OFFICE
CERTIFICATE OF CORRECTION

PATENT NO. : 6,300,153 B1
DATED : October 9, 2000
INVENTOR(S) : Tomoaki Koui

It is certified that error appears in the above-identified patent and that said Letters Patent is hereby corrected as shown below:

Title page, column 1,
Lines 1-3, should read -- METAL ORGANIC VAPOR PHASE EPITAXY METHOD AND METHOD FOR MANUFACTURING SEMICONDUCTOR LASER DEVICE --.

Signed and Sealed this

Thirteenth Day of November, 2001

*Attest:*

NICHOLAS P. GODICI
*Attesting Officer*     Acting Director of the United States Patent and Trademark Office

UNITED STATES PATENT AND TRADEMARK OFFICE
CERTIFICATE OF CORRECTION

PATENT NO.    : 6,300,153 B1
DATED         : October 9, 2001
INVENTOR(S)   : Tomoaki Koui It is certified that error appears in the above-identified patent and that said Letters Patent is hereby corrected as shown below:

<u>Title page, column 1,</u>
Lines 1-3, should read -- METAL ORGANIC VAPOR PHASE EPITAXY METHOD AND METHOD FOR MANUFACTURING SEMICONDUCTOR LASER DEVICE --.

This certificate supersedes certificate of correction issued November 13, 2001.

Signed and Sealed this

Twenty-third Day of July, 2002

*Attest:*

*Attesting Officer*

JAMES E. ROGAN
*Director of the United States Patent and Trademark Office*